(12) United States Patent
Jow et al.

(10) Patent No.: US 6,969,912 B2
(45) Date of Patent: Nov. 29, 2005

(54) EMBEDDED MICROELECTRONIC CAPACITOR INCORPORATING GROUND SHIELDING LAYERS AND METHOD FOR FABRICATION

(75) Inventors: Uei-Ming Jow, Taichung (TW);
Pei-Shen Wei, Yunghe (TW);
Ching-Liang Weng, Taipei (TW);
Chun-Kun Wu, Yunlin (TW);
Chang-Sheng Chen, Taipei (TW);
Ying-Jiunn Lai, Pingtung (TW)

(73) Assignee: Industrial Technology Research Institute, Hsinchu (TW)

( * ) Notice: Subject to any disclaimer, the term of this patent is extended or adjusted under 35 U.S.C. 154(b) by 32 days.

(21) Appl. No.: 10/713,804

(22) Filed: Nov. 14, 2003

(65) Prior Publication Data

US 2005/0104191 A1    May 19, 2005

(51) Int. Cl.[7] ............................................. H01L 23/48
(52) U.S. Cl. ....................... 257/758; 257/759; 257/760; 438/118; 438/622

(58) Field of Search ................................. 257/758–760; 438/118, 622

(56) References Cited

*Primary Examiner*—Fetsum Abraham
(74) *Attorney, Agent, or Firm*—Akin Gump Strauss Hauer & Feld, LLP

(57) ABSTRACT

An embedded microelectronic capacitor incorporating at least one ground shielding layer is provided which includes an upper ground shielding layer that has an aperture therethrough; an electrode plate positioned spaced-apart from the upper ground shielding layer that has a via extending upwardly away from the electrode plate through the aperture in the upper ground shielding layer providing electrical communication to the electrode plate without shorting to the upper ground shielding layer; a middle ground shielding layer positioned in the same plane of the electrode plate, surrounding while spaced-apart from the electrode plate at a predetermined distance; a lower ground shielding layer positioned spaced-apart from the electrode plate in an opposing relationship to the upper ground shielding layer; and a dielectric material embedding the upper ground shielding layer; the middle ground shielding layer and the lower ground shielding layer.

21 Claims, 4 Drawing Sheets

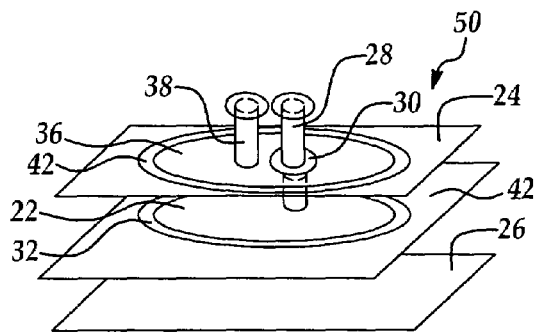
Figure 3
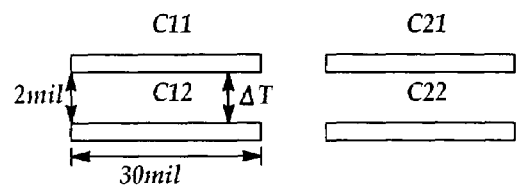
Figure 4A
| Distance between capacitors (ΔD) | Capacitance (pF) | | | |
|---|---|---|---|---|
| | C11 : C12 | C21 : C22 | C11 : C21 | C11 : C22 |
| 9 mil | 3.571 | 3.563 | 0.04013 | 0.06504 |
| 20 mil | 3.583 | 3.592 | 0.02183 | 0.02902 |
| 40 mil | 3.611 | 3.603 | 0.00587 | 0.01264 |
| 9 mil (ΔT = 3 mil) | 3.904 | 3.908 | 0.00171 | 0.00013 |
Figure 4B

EMBEDDED MICROELECTRONIC CAPACITOR INCORPORATING GROUND SHIELDING LAYERS AND METHOD FOR FABRICATION

FIELD OF THE INVENTION

The present invention generally relates to an embedded microelectronic capacitor and a method for fabrication and more particularly, relates to an embedded microelectronic capacitor that incorporates ground shielding layers for improved signal integrity and a method for fabricating the capacitor.

BACKGROUND OF THE INVENTION

In the development of modern technology for wireless communication, for digital computing equipment, for portable consumer electronics, the requirements for high frequency, wide band and miniaturization are most critical and must be met. One of the modern trend in such development is centered on the use of embedded components in order to reduce real estate occupied by such circuits. For instance, it is desirable for a circuit designer to replace a most commonly used component of a capacitor in a surface mount technology with an embedded capacitor. This can be achieved by utilizing various structures or materials to fabricate the embedded capacitor. However, when various different fabrication methods are used to embed a capacitor, the connection between the embedded capacitor and other circuit components frequently produces parasitic effects, thus adversely affect the electrical characteristics of the capacitor. The parasitic effect becomes worse as the frequency of the capacitor becomes higher. In the worst case, the capacitor characteristics can be affected to such a stage that it exhibits the characteristics of electrical inductance. The threshold frequency for such transition in characteristics is known as the self-vibration frequency of the component. In modern digital or analog circuits, design of the circuit is more desirably high frequency and wide band. The characteristics of the component that function under high frequency becomes even more important. It is therefore highly desirable to improve the electrode connection method in an embedded capacitor in order to increase its self-vibration frequency for use in high frequency circuit applications.

Conventionally, as shown in U.S. Pat. No. 6,191,934 entitled "High Dielectric Constant Embedded Capacitors", the connection method for the embedded capacitor is by edge connection. For instance, as shown in FIG. 1 of the patent, each electrode plate 14 is connected on the edge by a trace 16 wherein the terminal of the trace 16 is formed in a connecting pad 12. A series of connecting pads 12 are then electrically connected together by a lead 18 providing electrical connection for the embedded capacitor 10 to outside circuit components.

A disadvantage of the edge connection shown in FIG. 1 for the embedded capacitor 10 is that not only circuit real estate is increased due to the area occupied by trace 16 and by the connecting pads 12, the edge connection also produces unavoidable and difficult-to-analyze effective parasitic elements. As a result, the high frequency electrical characteristics of the embedded capacitor are severely affected to decrease the self-vibration frequency and to thus make such connection method inadequate in high frequency circuits.

In another conventional method for connecting embedded capacitors, as shown in FIG. 2A and by U.S. Pat. No. 5,400,210 entitled "Substrate Having a Built-In Capacitor and Process for Producing the Same", through via 22 is utilized in an embedded capacitor 20 for connecting to the positive and negative electrode plates. The point of connection is far away from the geometric center of the electrode plate and thus causing unbalanced high frequency effective circuit due to the variation in the distances between the connection point and the edges of the electrode plates. Such unbalanced high frequency effective circuit further deteriorates the high frequency electrical characteristics of the embedded capacitor such as its self-vibration frequency.

In the recent development of microelectronic fabrication, the device dimensions are continuously being reduced. As a result, multi-layered microelectronic circuits are being designed and used. In the multi-layered microelectronic structures, embedded device elements are frequently used in order to achieve a high density packaging of the device. The ever-decreasing distances between the embedded elements lead to various undesirable parasitic effect produced in-between the embedded elements. Moreover, other elements that surround the embedded device such as wiring, capacitors and inductors further produce coupling effect due to the short distances in-between the elements. The coupling effect produces a loss in signal integrity due to cross-talking phenomenon.

It is therefore an object of the present invention to provide an embedded microelectronic capacitor without the drawbacks or shortcomings of the convention embedded capacitors.

It is another object of the present invention to provide an embedded microelectronic capacitor that incorporates ground shielding layers in the capacitor structure for maintaining signal integrity and reducing cross-talk.

It is a further object of the present invention to provide a method for fabricating an embedded capacitor that incorporates ground shielding layers.

SUMMARY OF THE INVENTION

In accordance with the present invention, an embedded microelectronic capacitor incorporating ground shielding layers and a method for fabricating the embedded microelectronic capacitor are provided.

In a preferred embodiment, an embedded microelectronic capacitor incorporating ground shielding layer is provided which includes an upper ground shielding layer that has an aperture therethrough; an electrode plate positioned spaced-apart from the upper ground shielding layer that has a via extending upwardly away from the electrode plate through the aperture in the upper ground shielding layer providing electrical communication to the electrode plate without shorting to the upper ground shielding layer; a middle ground shielding layer positioned in the same plane of the electrode plate, surrounding while spaced-apart from the electrode plate at a predetermined distance; a lower ground shielding layer positioned spaced-apart from the electrode plate in an opposing relationship to the upper ground shielding layer; and a dielectric material embedding the upper ground shielding layer; the middle ground shielding layer and the lower ground shielding layer.

In the embedded microelectronic capacitor incorporating ground shielding layers, the pre-determined distance between the middle ground shielding layer and the electrode plate is at least 0.2 mm. The middle ground shielding layer may be electrically connected to the upper and the lower ground shielding layers by at least one via. The upper ground shielding layer, the electrode plate, the middle ground shielding layer and the lower ground shielding layer are fabricated of an electrically conductive metal, such as Cu or Al. The via may be formed of a low electrical resistance metal. The upper ground shielding layer, the electrode plate, the middle ground shielding layer and the lower ground shielding layer may each have a thickness between about 0.01 mm and about 0.1 mm. The upper ground shielding layer, the electrode plate and the lower ground shielding layer are embedded parallel to each other at a distance between about 0.05 mm and about 0.5 mm, respectively.

The present invention is further directed to a method for fabricating an embedded microelectronic capacitor with ground shielding layers which can be carried out by the operating steps of providing a core dielectric layer; patterning and forming a first plurality of via holes in the core dielectric layer; depositing an electrode plate layer on a top surface of the core dielectric layer filming the first plurality of via holes and a first plurality of vias, a plurality of electrode plates and a middle ground shielding layer for each of the plurality of electrode plates and for connected to each of the plurality of vias; depositing a fourth metal layer on a bottom surface of the core dielectric layer; laminating a first dielectric layer onto the top surface of the core dielectric layer and forming a second plurality of via holes therethrough, each communicating with one of the plurality of electrode plates and the middle ground shielding layer; and laminating a second dielectric layer onto the bottom surface of the core dielectric layer.

The method for fabricating an embedded microelectronic capacitor may further include the step of depositing the electrode plate layer in an electrically conductive metal, or the step of depositing the electrode plate layer in Cu or Al. The method may further include the step of forming the plurality of vias in a low electrical resistance metal, depositing the electrode plate layer to a thickness between about 0.01 mm and about 0.1 mm, or forming the plurality of electrode plates at a distance between about 0.05 mm and about 0.5 mm from the fourth metal layer.

The present invention is still further directed to an embedded microelectronic capacitor incorporating ground shielding layers which includes an upper electrode plate that has a via extending upwardly away from the upper electrode plate and an aperture therethrough; an upper ground shielding layer positioned in the same plane of the upper electrode plate surrounding while spaced-apart from the upper electrode plate at a pre-determined distance; a middle electrode plate positioned spaced-apart from the upper electrode plate that has a via extending upwardly away from the middle electrode plate through the aperture in the upper electrode plate providing electrical communication to the middle electrode plate without shorting to the upper electrode plate; a middle ground shielding layer positioned in the same plane of the middle electrode plate, surrounding while spaced-apart from the middle electrode plate at a predetermined distance; a lower ground shielding layer positioned spaced-apart from the electrode plate in an opposing relationship to the upper ground shielding layer; and a dielectric material embedding the upper ground shielding layer, the middle ground shielding layer and the lower ground shielding layer.

In the embedded microelectronic capacitor incorporating ground shielding layers, the pre-determined distance between the middle ground shielding layer and the middle electrode plate and between the upper ground shielding layer and the upper electrode plate is at least 0.2 mm. The middle ground shielding layer may be electrically connected to the upper and the lower ground shielding layers by at least one via. The upper ground shielding layer, the middle ground shielding layer and the lower ground shielding layer may be fabricated of an electrically conductive metal. The upper ground shielding layer, the middle ground shielding layer and the lower ground shielding layer may each have a thickness between about 0.01 mm and about 0.1 mm. The upper ground shielding layer, the middle ground shielding layer and the lower ground shielding layer are embedded parallel to each other at a distance between about 0.05 mm and about 0.5 mm, respectively.

BRIEF DESCRIPTION OF THE DRAWINGS

These and other objects, features and advantages of the present invention will become apparent from the following detailed description and the appended drawings in which:

FIG. 3 is a perspective view of another embodiment of the present invention embedded microelectronic capacitor equipped with two ground shielding layers.

FIG. 4A is a schematic illustrating various layouts for the present invention embedded microelectronic capacitors.

FIG. 4B is a table showing test data obtained on the various layouts shown in FIG. 4A.

DETAILED DESCRIPTION OF THE PREFERRED AND ALTERNATE EMBODIMENTS

The invention discloses an embedded microelectronic capacitor that incorporates ground shielding layers for improved electronic characteristics and reduced parasitic effect. The invention further discloses a method for fabricating an embedded microelectronic capacitor that has built-in ground shielding layers.

The embedded micro-electronic capacitor is provided with an upper ground shielding layer that has an aperture therethrough adapted for receiving a via that extends upwardly from an electrode plate situated under the upper ground shielding layer. In an alternate embodiment, the upper ground shielding layer is replaced by an electrode plate that is surrounded by a frame-type grounding shielding layer with a via provided on the electrode plate for electrical communication with outside circuit.

In the preferred embodiment, the structure further includes a middle ground shielding layer that is positioned in the same plane of the middle electrode plate, surrounding in a spaced-apart manner from the middle electrode plate at a predetermined distance. The structure further includes a lower ground shielding layer that is situated under the middle electrode plate in an opposing relationship to the upper ground shielding layer. The upper ground shielding layer, the electrode plate, the middle ground shielding layer and the lower ground shielding layer are embedded in a dielectric material forming the capacitor.

The present invention embedded microelectronic capacitor achieves numerous benefits such as a reduction in the capacitor-to-capacitor distance, a reduction in the parasitic and fringe capacitance and improved capacitance value. Furthermore, the capacitor can be fabricated by conventional integrated circuit processes, printed circuit board processes and ceramic substrate processes. The capacitors can be connected in series or in parallel forming a multi-layered structure to achieve a high density interconnection scheme for use in three-dimensional packaging technology.

Figure 1:
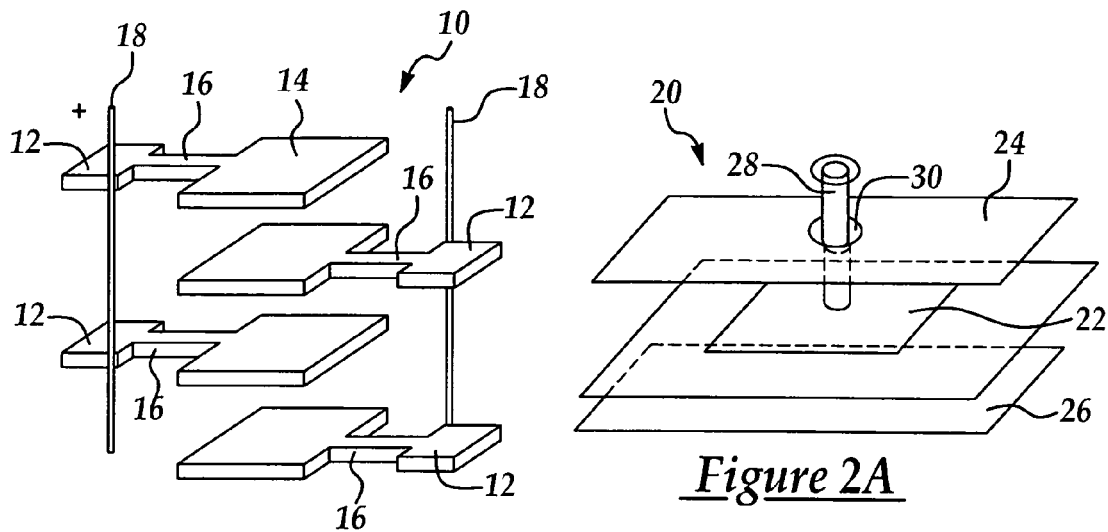
FIG. 1 is a perspective view of a conventional edge connection method for embedded capacitors.
Figure 2A:
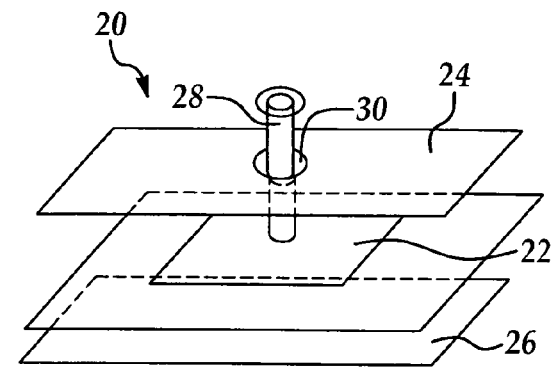
FIG. 2A is a perspective view of a present invention embedded microelectronic capacitor without ground shielding layers.

Referring initially to FIG. 2A wherein an embedded microelectronic capacitor 20 that is not equipped with ground shielding layers is shown. A center electrode plate 22 is sandwiched in-between an upper electrode plate 24 and a lower electrode plate 26 forming a capacitor. A center via 28 provides electrical communication to the middle electrode plate 22 through an aperture 30 formed in the upper electrode plate 24. A dielectric material (not shown) is used to fill the space in-between the upper electrode plate 24 and the lower electrode plate 26.

Figure 2B:
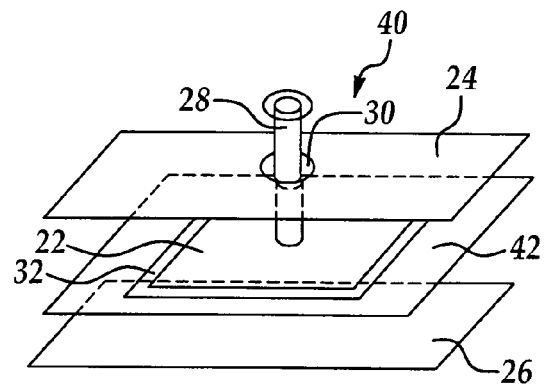
FIG. 2B is a perspective view of a present invention embedded microelectronic capacitor incorporating a ground shielding layer.

A preferred embodiment of the present invention embedded microelectronic capacitor 40 incorporating a ground shielding layer 42 is shown in FIG. 2B. The structure of capacitor 40 is similar to that of capacitor 20 shown in FIG. 2A, except a middle ground shielding layer 42 is formed in the same plane as the middle electrode plate 22 and surrounding the same to provide a ground shielding effect. The middle ground shielding layer 42 is formed spaced-apart from the middle electrode plate 22 at a pre-determined spacing 32 for providing electrical insulation with the middle electrode plate 22.

In the preferred embodiment capacitor 40, shown in FIG. 2B, the pre-determined spacing between the middle ground shielding layer 42 and the middle electrode plate 22 is at least 0.2 mm, and preferably in a range between about 0.2 mm and about 2 mm. The middle ground shielding layer 22 may be electrically connected to the upper ground shielding layer 24 and the lower ground shielding layer 26 by at least one via 44 (shown in FIG. 5C). Two or more via may be preferred. The upper ground shielding layer 24, the electrode plate 22, the middle ground shielding layer 42 and the lower ground shielding layer 26 may be fabricated of an electrically conductive metal. A suitable metal is Cu or Al. The via 44 may be formed of a low electrical resistance metal. The dimension of the capacitor 40 may be suitably 5 mm×5 mm with a distance of 2 mm between the upper ground shielding layer 24 and the middle ground shielding layer 42, or between the middle ground shielding layer 42 and the lower ground shielding layer 26. The upper ground shielding layer 24, the electrode plate 22, the middle ground shielding layer 42 and the lower ground shielding layer 26 may each have a thickness between about 0.01 mm and about 0.5 mm.

Figure 2C:
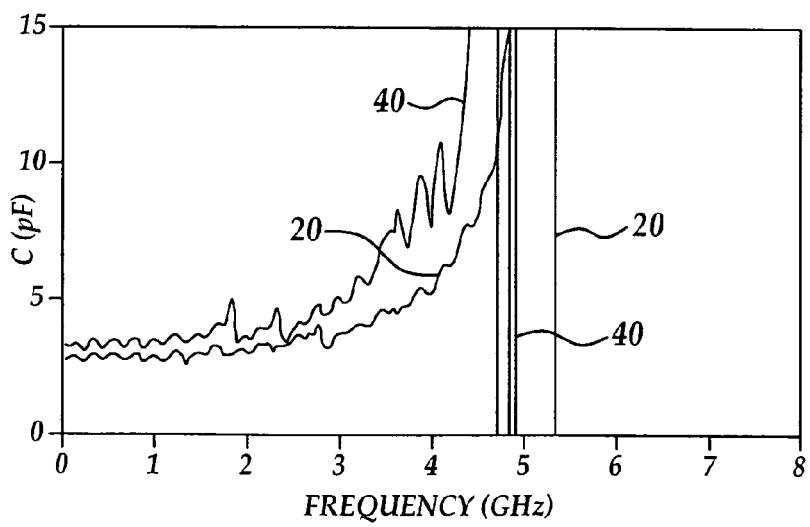
FIG. 2C shows test data of capacitance obtained on the devices shown in FIGS. 2A and 2B, respectively.

The desirable effects of the present invention preferred embodiment capacitor 40 when compared to an embedded capacitor 20 without the middle ground shielding layer is shown in FIG. 2C. Two curves are shown in the Figure, each representing the capacitor 20 and 40, respectively as shown. The pre-determined distance 32 between the middle electrode plate 22 and the middle ground shielding layer 42 is about 0.5 mm which produces a capacitance of about 3.25 pF. This is favorably compared to a capacitance of 2.76 pF for capacitor 20 without the middle ground shielding layer. Moreover, the undesirable parasitic capacitance and the fringe capacitance are significantly reduced in the present invention embedded capacitor 40.

An alternate embodiment of the present invention embedded capacitor 50 incorporating ground shielding layers 24, 42 and 26 is shown in FIG. 3. The major difference in this alternate embodiment structure when compared to the preferred embodiment structure shown in FIG. 2B is the additional upper ground shielding layer 24 which shields the upper electrode plate 36. The upper electrode plate 36 further communicates electrically through via 38. A pre-determined distance 42 is maintained in-between the upper electrode plate 36 and the upper ground shielding layer 24 which is similar to the pre-determined distance 32 for the middle electrode plate 22. The material used for forming the upper electrode plate 36 is also similar to that used in forming the middle electrode plate 22. The location of the vias 28 and 38 should be arranged as close to the geometrical center of the electrode plate 36 as possible.

The effects of the dimensions of the present invention embedded capacitors on the capacitance values is shown in FIGS. 4A and 4B. It is known that both ΔT (the distance between two parallel capacitors) and ΔD (the distance between a capacitor plate and a middle ground trace which is not shown in FIG. 4A) are important on the capacitance of the embedded capacitors. The middle ground trace may have a width of about 3 mil. For instance, data for four capacitors with ΔT=2 mil and dimensions of 30 mil×30 mil is shown in the table of FIG. 4B. It is seen that the highest capacitance in pica Faraday is obtained at ΔD=9 mil and ΔT=3 mil at 3.904 and 3.908, respectively. The data are obtained through computer simulation results.

The data further indicates that the pre-determined spacing between the electrode plate and the surrounding ground shielding layer should be smaller than 5 times the thickness of the electrode plate. Similarly, the planar area of the surrounding ground shielding layer should be between 1.5 and 2 times of the planar area of the electrode plate. While it is shown in FIGS. 2B and 3, a rectangular shape for the ground shielding layer, any other suitable shapes for the layer may serve essentially the same function. As shown by the data in FIG. 4B, the present invention novel embedded capacitor provides higher capacitance values.

Figure 5A:
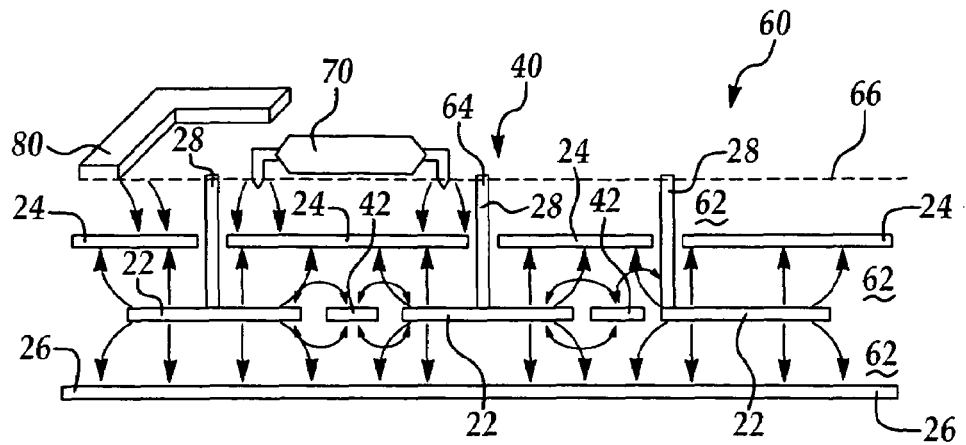
FIGS. 5A, 5B and 5C are enlarged, cross-sectional views illustrating the present invention embedded microelectronic capacitor equipped with an upper ground shielding layer, a middle ground shielding layer and a bottom ground shielding layer.
Figure 5B:
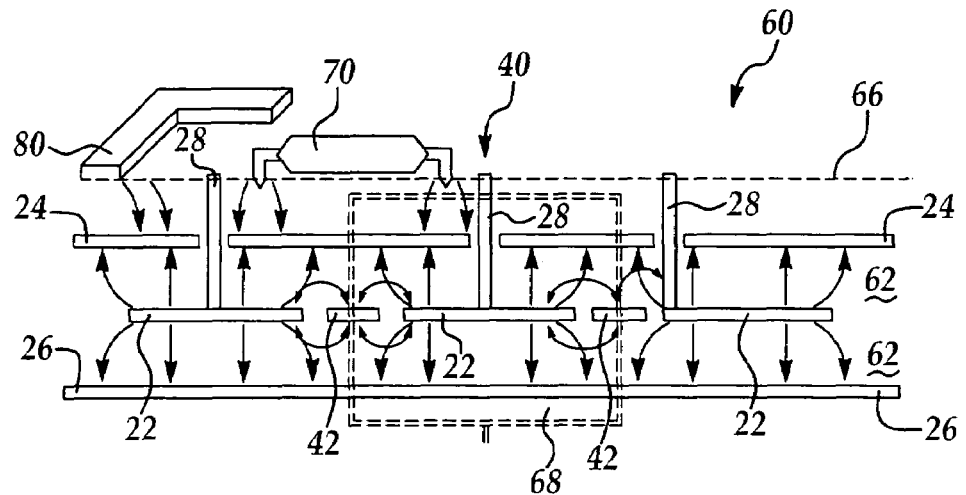
Figure 5C:
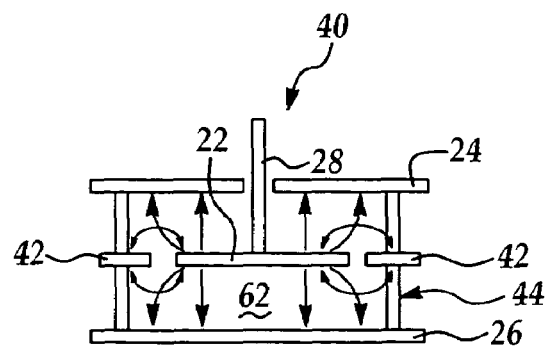

A device structure 60 utilizing the present invention embedded capacitor 40 is shown in FIGS. 5A, 5B and 5C in enlarged, cross-sectional views. It is seen that a dielectric material 62 is used to fill gaps between the upper ground shielding layer 24 and the lower ground shielding layer 26, and furthermore, to embed the top of the upper ground shielding layer 24 such that only the tip 64 of the via 28 is shown. It should be noted that in FIGS. 5A and 5B, three adjacent embedded capacitors 40 are shown formed side-to-side. An active device 70 and a signal trace 80 for a surface mount technology (SMT) device are mounted and formed on the top surface 66 of the dielectric encapsulation layer 62. It should be noted that box 68 shown in FIG. 5B is illustrated in FIG. 5C as an individual unit of capacitor 40.

Figure 6A:
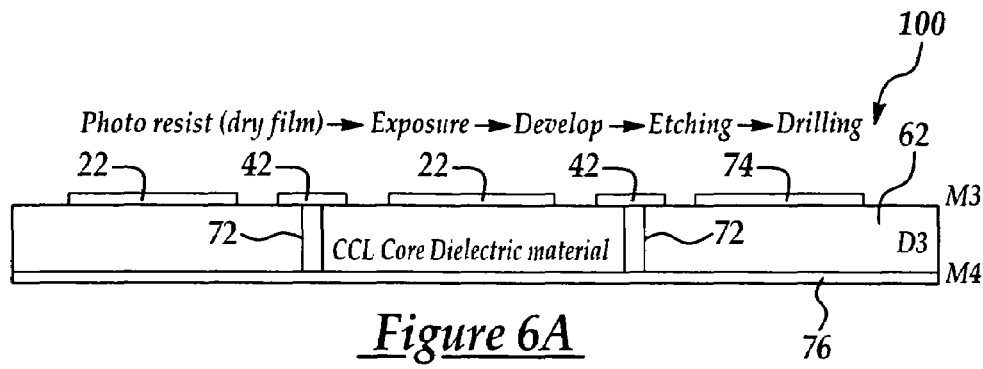
FIGS. 6A, 6B and 6C are enlarged, cross-sectional views illustrating the present invention fabrication process for fabricating the embedded microelectronic capacitor.
Figure 6B:
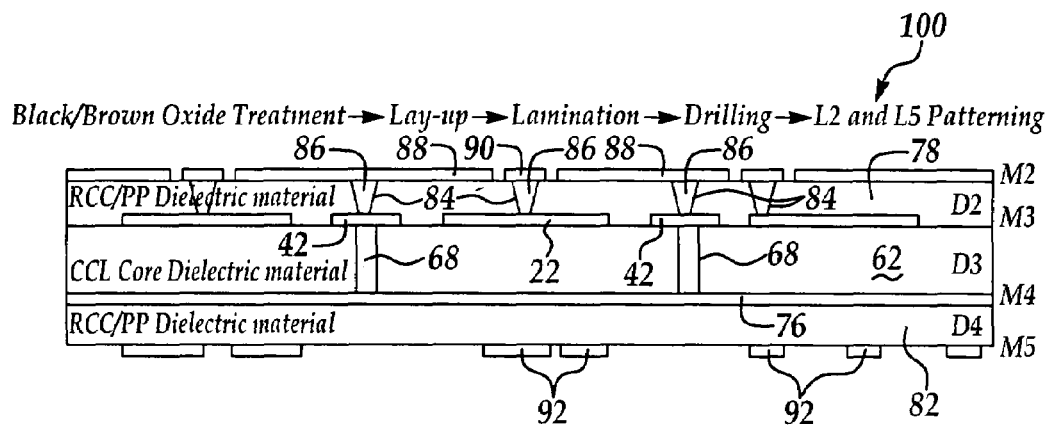
Figure 6C:
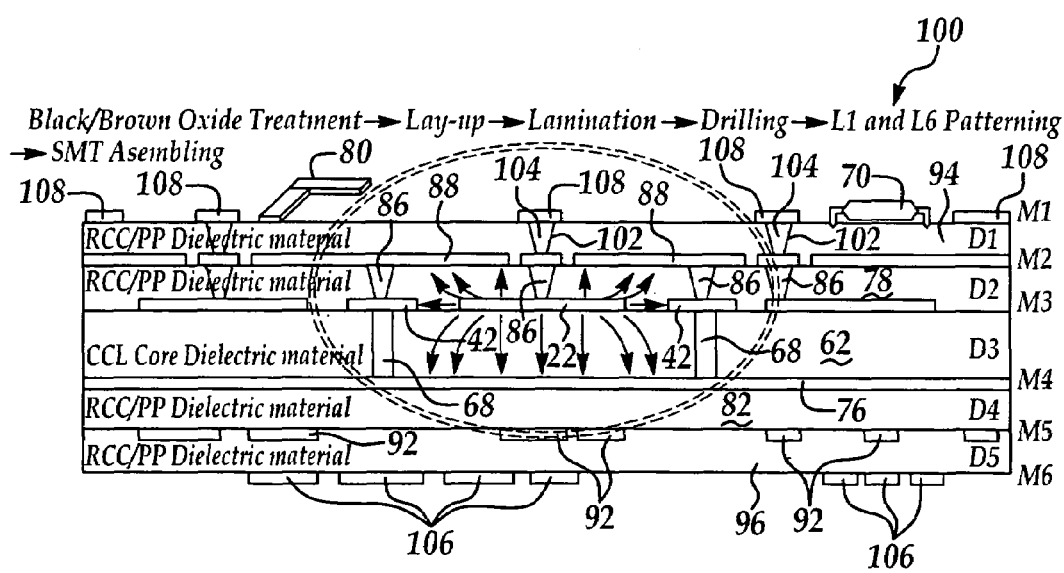

The fabrication process for the present invention embedded capacitor 100 is shown in FIGS. 6A, 6B and 6C in enlarged, cross-sectional views. It is seen that a core dielectric material layer 62 is first provided in a photoresist dry film. A photolithography process is then conducted to pattern and form via holes 72 through the dielectric material layer 62. A laser drilling process may also be used to form the via holes 72. Subsequently, metal layers 74, 76 are sputter deposited on the top and bottom surfaces of the core dielectric material layer 62. The metal layer 74 is then formed into middle ground shielding layer 42 and electrode plate 22.

The next step of the process is performed by a lamination step, shown in FIG. 6B. Dielectric material layers 78, 82 are laminated onto the top and bottom surfaces of the core dielectric layer 62. Via holes 84 are then formed in the dielectric material layer 78 and filled with a high electrical conductivity metal to form vias 86, upper ground shielding layer 88 and electrode plate 90. Wiring leads 92 are further formed on the bottom surface of the dielectric material layer 82.

In the final step of the process, a second lamination process is conducted to further laminate dielectric material layers 94 and 96 on the top and bottom surfaces of the capacitor 100. Via holes 102 and vias 104 are similarly formed in the dielectric material layer 94, as previously described. Circuit wiring leads 106 are similarly formed on the bottom surface of the dielectric material layer 96. Signal trace 80 for a SMT device and active device 70 are formed or mounted on the top surface of the dielectric layer 94. Lead wires 108 are also formed on the top surface of the dielectric material layer 94. It should be noted that the device indicated in the dashed lines in FIG. 6C is the present invention embedded capacitor that is equipped with both an upper ground shielding ring and a middle ground shielding ring.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. An embedded microelectronic capacitor incorporating ground shielding layers comprising:
    an upper ground shielding layer having an aperture therethrough;
    an electrode plate positioned spaced-apart from said upper ground shielding layer having a via extending upwardly away from said electrode plate through said aperture in said upper ground shielding layer providing electrical communication to said electrode plate without shorting to said upper ground shielding layer;
    a middle ground shielding layer positioned in the same plane of said electrode plate and surrounding while spaced-apart from said electrode plate at a predetermined distance; and
    a dielectric material embedding said upper ground shielding layer and said middle ground shielding layer.

2. An embedded microelectronic capacitor incorporating ground shielding layers according to claim 1, further comprising a lower ground shielding layer positioned spaced-apart from said electrode plate in an opposing relationship to said upper ground shielding layer.

3. An embedded microelectronic capacitor incorporating ground shielding layers according to claim 1, wherein said middle ground shielding layer is electrically connected to said upper ground shielding layer by at least one via.

4. An embedded microelectronic capacitor incorporating ground shielding layers according to claim 1, wherein said upper ground shielding layer, said electrode plate and said middle ground shielding layer are fabricated of an electrically conductive metal.

5. An embedded microelectronic capacitor incorporating ground shielding layers according to claim 2, wherein said upper ground shielding layer, said electrode plate, said middle ground shielding layer and said lower ground shielding layer are fabricated of Cu or Al.

6. An embedded microelectronic capacitor incorporating ground shielding layers according to claim 1, wherein said via is formed of a low electrical resistance metal.

7. An embedded microelectronic capacitor incorporating ground shielding layers according to claim 2, wherein said upper ground shielding layer, said electrode plate, said middle ground shielding layer and said lower ground shielding layer each having a thickness between about 0.01 mm and about 0.1 mm.

8. An embedded microelectronic capacitor incorporating ground shielding layers according to claim 1, wherein said upper ground shielding layer and said electrode plate are embedded parallel to each other at a distance between about 0.05 mm and about 0.5 mm, respectively.

9. A method for fabricating an embedded microelectronic capacitor with ground shielding layers comprising the steps of:
    providing a core dielectric layer;
    patterning and forming a first plurality of via holes in said core dielectric layer;
    depositing an electrode plate layer material on a top surface of said core dielectric layer filling said first plurality of via holes and forming a first plurality of vias,
    patterning and etching the electrode plate layer material to form a plurality of electrode plates and a plurality of middle ground shielding layers, wherein each of the plurality of electrode plates connects to each of the first plurality of vias;
    depositing a metal layer on a bottom surface of the core dielectric layer;
    laminating a first dielectric layer onto the top surface of the plurality of middle ground shielding layers and the plurality of electrode plates and forming a second plurality of via holes therethrough, each of the second plurality of via holes communicating with one of the plurality of electrode plates and the middle ground shielding layer; and
    laminating a second dielectric layer onto the bottom surface of the core dielectric layer.

10. A method for fabricating an embedded microelectronic capacitor according to claim 9, wherein said electrode plate layer material is an electrically conductive metal.

11. A method for fabricating an embedded microelectronic capacitor according to claim 9, wherein said electrode plate layer material is Cu or Al.

12. A method for fabricating an embedded microelectronic capacitor according to claim 9, further comprising the step of forming said plurality of vias in a low electrical resistance metal.

13. A method for fabricating an embedded microelectronic capacitor according to claim 9, further comprising the step of depositing said electrode plate layer material to a thickness between about 0.01 mm and about 0.1 mm.

14. A method for fabricating an embedded microelectronic capacitor according to claim 9, further comprising the step of forming said plurality of electrode plates at a distance between about 0.05 mm and about 0.5 mm from said fourth metal layer.

15. An embedded microelectronic capacitor incorporating ground shielding layers comprising:
    an upper electrode plate having a via extending upwardly away from said plate and an aperture therethrough;
    an upper ground shielding layer positioned in the same plane of said upper electrode plate, surrounding while spaced-apart from said upper electrode plate at a pre-determined distance;
    a middle electrode plate positioned spaced-apart from said upper electrode plate having a via extending upwardly away from said middle electrode plate through said aperture in said upper electrode plate providing electrical communication to said middle electrode plate without shorting to said upper electrode plate;
    a middle ground shielding layer positioned in the same plane of said middle electrode plate, surrounding while spaced-apart from said middle electrode plate at a pre-determined distance;
    a lower ground shielding layer positioned spaced-apart from said electrode plate in an opposing relationship to said upper ground shielding layer; and
    a dielectric material embedding said upper ground shielding layer, said middle ground shielding layer and said lower ground shielding layer.

16. An embedded microelectronic capacitor incorporating ground shielding layers according to claim 15, wherein said pre-determined distance between said middle ground shielding layer and said middle electrode plate and between said upper ground shielding layer and said upper electrode plate is at least 0.2 mm.

17. An embedded microelectronic capacitor incorporating ground shielding layers according to claim 15, wherein said middle ground shielding layer is electrically connected to said upper and said lower ground shielding layers by at least one via.

18. An embedded microelectronic capacitor incorporating ground shielding layers according to claim 15, wherein said upper ground shielding layer, said middle ground shielding layer and said lower ground shielding layer are fabricated of an electrically conductive metal.

19. An embedded microelectronic capacitor incorporating ground shielding layers according to claim 15, wherein said dielectric material comprises a low dielectric constant material.

20. An embedded microelectronic capacitor incorporating ground shielding layers according to claim 15, wherein said upper ground shielding layer, said middle ground shielding layer and said lower ground shielding layer are embedded parallel to each other at a distance between about 0.05 mm and about 0.5 mm, respectively.

21. An embedded microelectronic capacitor incorporating ground shielding layers according to claim 15, wherein said dielectric material comprises a high dielectric constant material.

\* \* \* \* \*